(12) United States Patent
Chen et al.

(10) Patent No.: US 11,050,017 B2
(45) Date of Patent: Jun. 29, 2021

(54) SEMICONDUCTOR DEVICE AND METHOD FOR FABRICATING THE SAME

(71) Applicant: UNITED MICROELECTRONICS CORP., Hsin-Chu (TW)

(72) Inventors: Yu-Chun Chen, Kaohsiung (TW); Ya-Sheng Feng, Tainan (TW); Chiu-Jung Chiu, Tainan (TW); Hung-Chan Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/850,003

(22) Filed: Apr. 16, 2020

(65) Prior Publication Data

US 2020/0243753 A1 Jul. 30, 2020

Related U.S. Application Data

(63) Continuation of application No. 16/178,542, filed on Nov. 1, 2018, now Pat. No. 10,665,772.

(30) Foreign Application Priority Data

Oct. 8, 2018 (CN) .......................... 201811166521.9

(51) Int. Cl.
| | |
|---|---|
| *H01L 43/02* | (2006.01) |
| *H01L 23/535* | (2006.01) |
| *H01L 43/12* | (2006.01) |
| *H01L 27/22* | (2006.01) |
| *H01L 43/10* | (2006.01) |
| *G11C 11/16* | (2006.01) |

(52) U.S. Cl.
CPC ............ *H01L 43/02* (2013.01); *H01L 23/535* (2013.01); *H01L 27/222* (2013.01); *H01L 43/12* (2013.01); *G11C 11/161* (2013.01); *H01L 43/10* (2013.01)

(58) Field of Classification Search
CPC ..... H01L 27/228; H01L 27/222; H01L 43/02; H01L 43/08
See application file for complete search history.

(56) References Cited

U.S. PATENT DOCUMENTS

| | | | |
|---|---|---|---|
| 2010/0200900 A1 | 8/2010 | Iwayama | |
| 2013/0015541 A1* | 1/2013 | Kanaya | H01L 43/12 257/421 |
| 2018/0097173 A1* | 4/2018 | Chuang | H01L 45/1675 |
| 2018/0097175 A1 | 4/2018 | Chuang | |
| 2018/0366517 A1 | 12/2018 | Lin | |
| 2019/0280195 A1 | 9/2019 | Sonoda | |

* cited by examiner

*Primary Examiner* — Changhyun Yi
(74) *Attorney, Agent, or Firm* — Winston Hsu

(57) ABSTRACT

A semiconductor device includes a magnetic tunneling junction (MTJ) on a substrate, a first spacer on one side of the MTJ, and a second spacer on another side of the MTJ, in which the first spacer and the second spacer are asymmetric. Specifically, the MTJ further includes a first bottom electrode disposed on a metal interconnection, a capping layer on the bottom electrode, and a top electrode on the capping layer, in which a top surface of the first spacer is even with a top surface of the top electrode and a top surface of the second spacer is lower than the top surface of the top electrode and higher than the top surface of the capping layer.

11 Claims, 7 Drawing Sheets

SEMICONDUCTOR DEVICE AND METHOD FOR FABRICATING THE SAME

CROSS REFERENCE TO RELATED APPLICATIONS

This is a continuation application of U.S. patent application Ser. No. 16/178,542, filed on Nov. 1, 2018, and all benefits of such earlier application are hereby claimed for this new continuation application.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes a magnetic tunneling junction (MTJ) on a substrate, a first spacer on one side of the MTJ, and a second spacer on another side of the MTJ, wherein the first spacer and the second spacer are asymmetric. Specifically, the MTJ further includes a first bottom electrode disposed on a metal interconnection, a barrier layer on the bottom electrode, and a top electrode on the barrier layer, in which a top surface of the first spacer is even with a top surface of the top electrode and a top surface of the second spacer is lower than the top surface of the top electrode and higher than the top surface of the barrier layer.

According to another aspect of the present invention, a semiconductor device includes a magnetic tunneling junction (MTJ) on a substrate and a metal interconnection on the MTJ. Preferably, a top view of the MTJ comprises a first circle and a top view of the metal interconnection comprises a second circle overlapping part of the first circle. Moreover, a part of the first circle not overlapped by the second circle comprises a first crescent moon, and a part of the second circle not overlapping the second circle comprises a second crescent moon.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
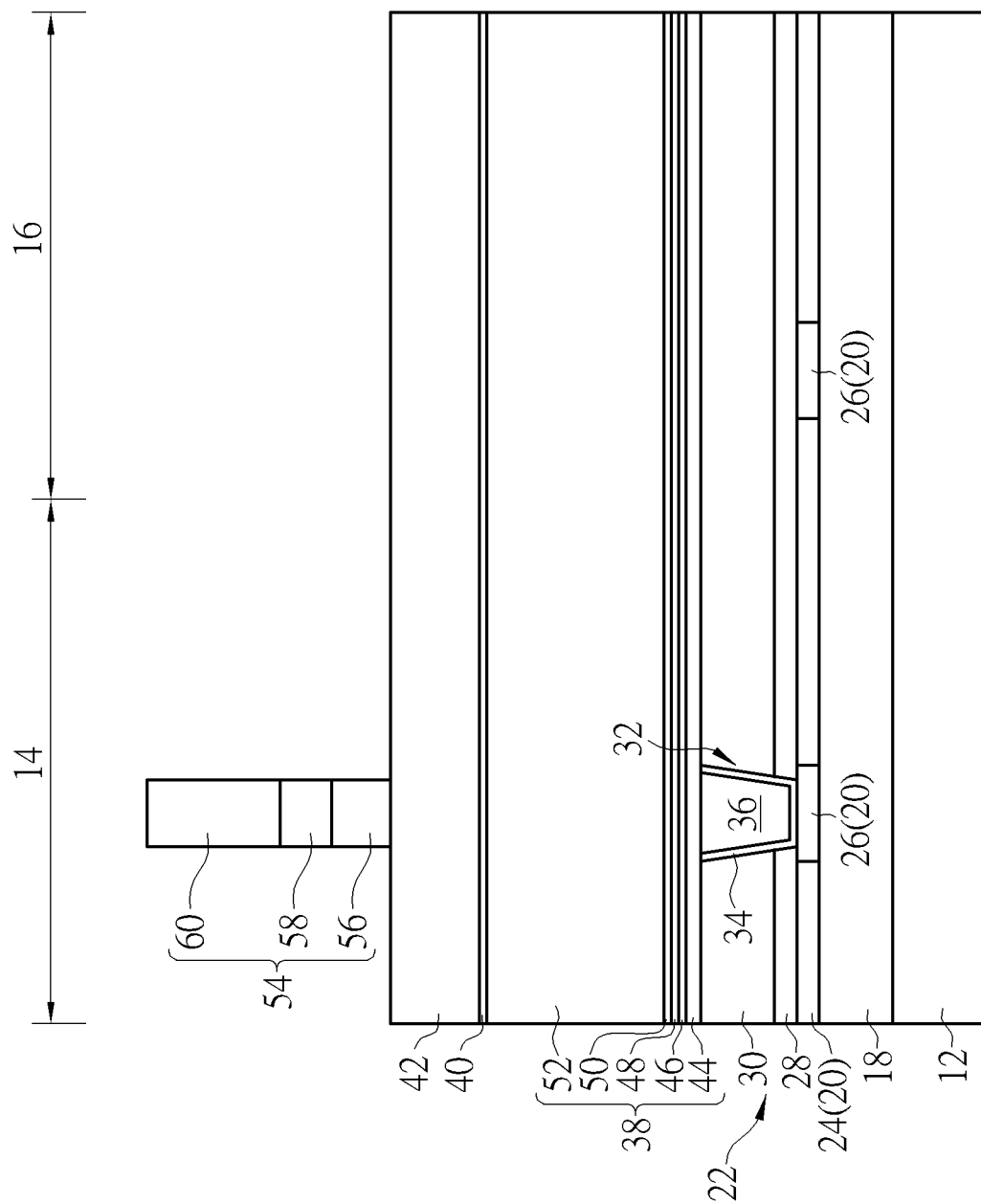
FIGS. 1-6 illustrate a method for fabricating a MRAM device according to an embodiment of the present invention.

Referring to FIGS. 1-6, FIGS. 1-6 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region 80, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a free layer 48, a capping layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field. The capping layer 50 could be made of insulating material including but not limited to for example oxides such as aluminum oxide (AlO$_x$) or magnesium oxide (MgO). Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
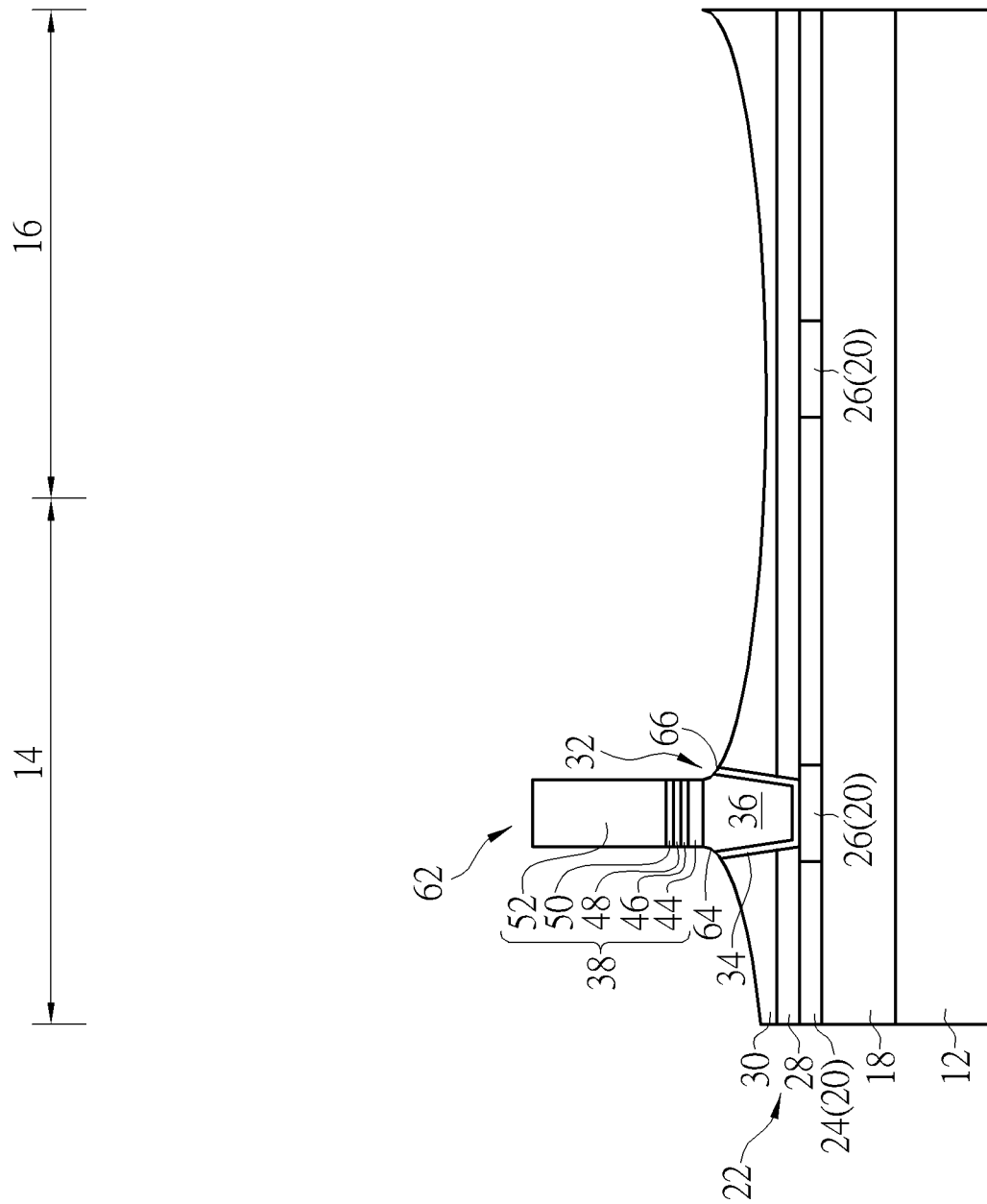

Next, as shown in FIG. 2, one or more etching process is conducted by using the patterned mask 54 as mask to remove part of the cap layers 40, 42, part of the MTJ stack 38, and part of the IMD layer 30 to form a MTJ 62 on the MTJ region 14, in which the first electrode layer 44 at this stage preferably becomes a bottom electrode 76 for the MTJ 62 while the second electrode layer 52 becomes a top electrode 78 for the MTJ 62 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJ 62. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJ 62, in which each of the first slanted sidewall 64 and the second slanted sidewall 66 could further include a curve (or curved surface) or a planar surface.

Figure 3:
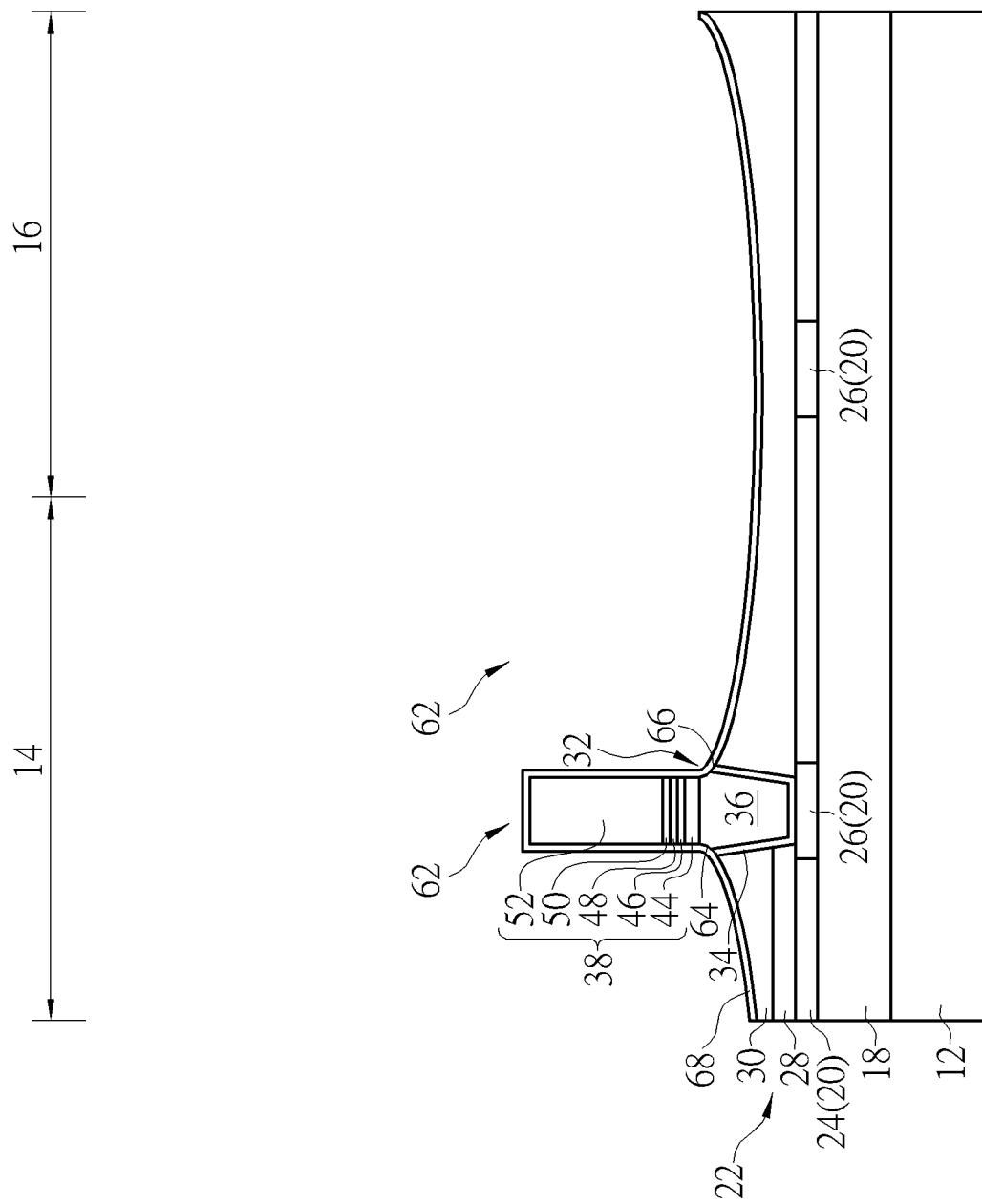

Next, as shown in FIG. 3, a liner 68 is formed on the MTJ 62 to cover the surface of the IMD layer 30. In this embodiment, the liner 68 is preferably made of silicon oxide, but could also be made of other dielectric material including but not limited to for example silicon oxide, silicon oxynitride, or silicon carbon nitride.

Figure 4:
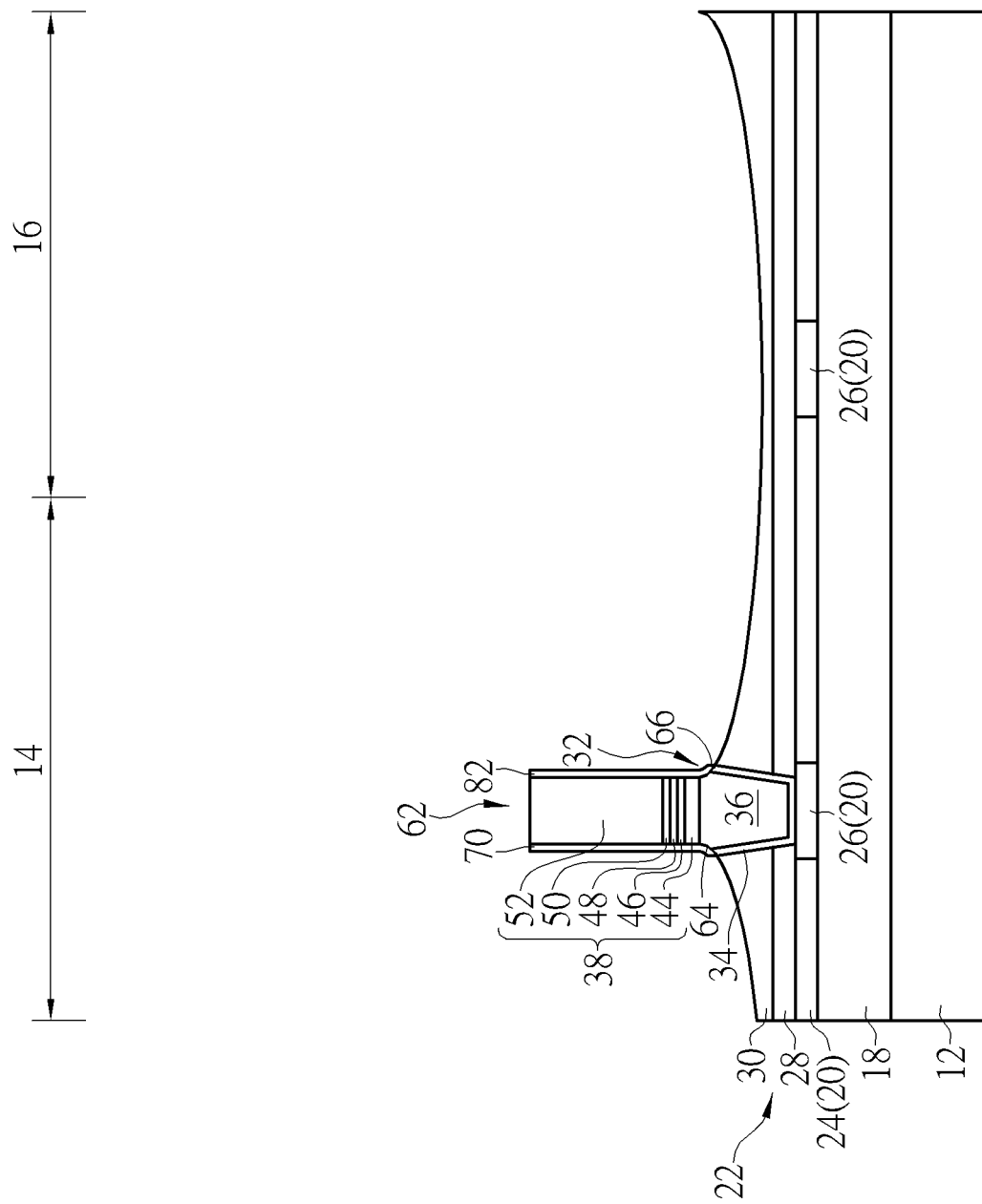

Next, as shown in FIG. 4, an etching process is conducted to remove part of the liner 68 to form a spacer adjacent to each of the MTJ 62, in which the spacer includes a first spacer 70 on a sidewall of the MTJ 62 and contacting the first slanted sidewall 64 directly and a second spacer 82 on another sidewall of the MTJ 62 and contacting the second slanted sidewall 66 of the metal interconnection 32 directly.

Figure 5:
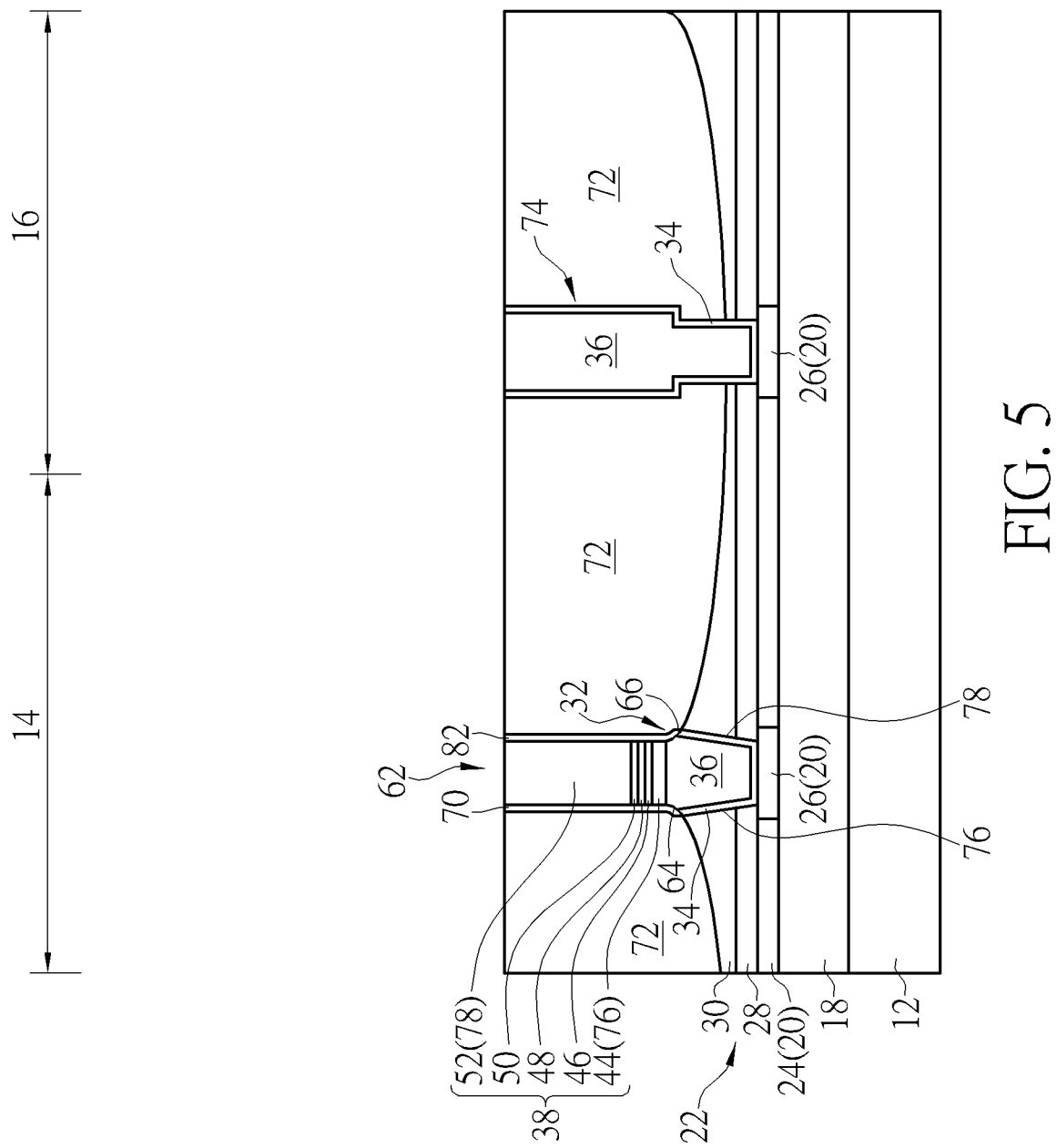

Next, as shown in FIG. 5, another IMD layer 72 is formed on the MTJ region 14 and logic region 16, and a planarizing process such as CMP is conducted to remove part of the IMD layer 72 so that the top surface of the IMD layer 72 is even with the top surface of the MTJ 62. Next, a pattern transfer process is conducted by using a patterned mask (not shown) to remove part of the IMD layer 72 on the logic region 16 to form a contact hole (not shown) exposing the metal interconnection 26 underneath and metals are deposited into the contact hole afterwards. For instance, a barrier layer 34 selected from the group consisting of titanium (Ti), titanium nitride (TiN), tantalum (Ta), and tantalum nitride (TaN) and metal layer 36 selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the metals including the aforementioned barrier layer and metal layer to form a contact plug 74 in the contact hole electrically connecting the metal interconnection 26.

Figure 6:
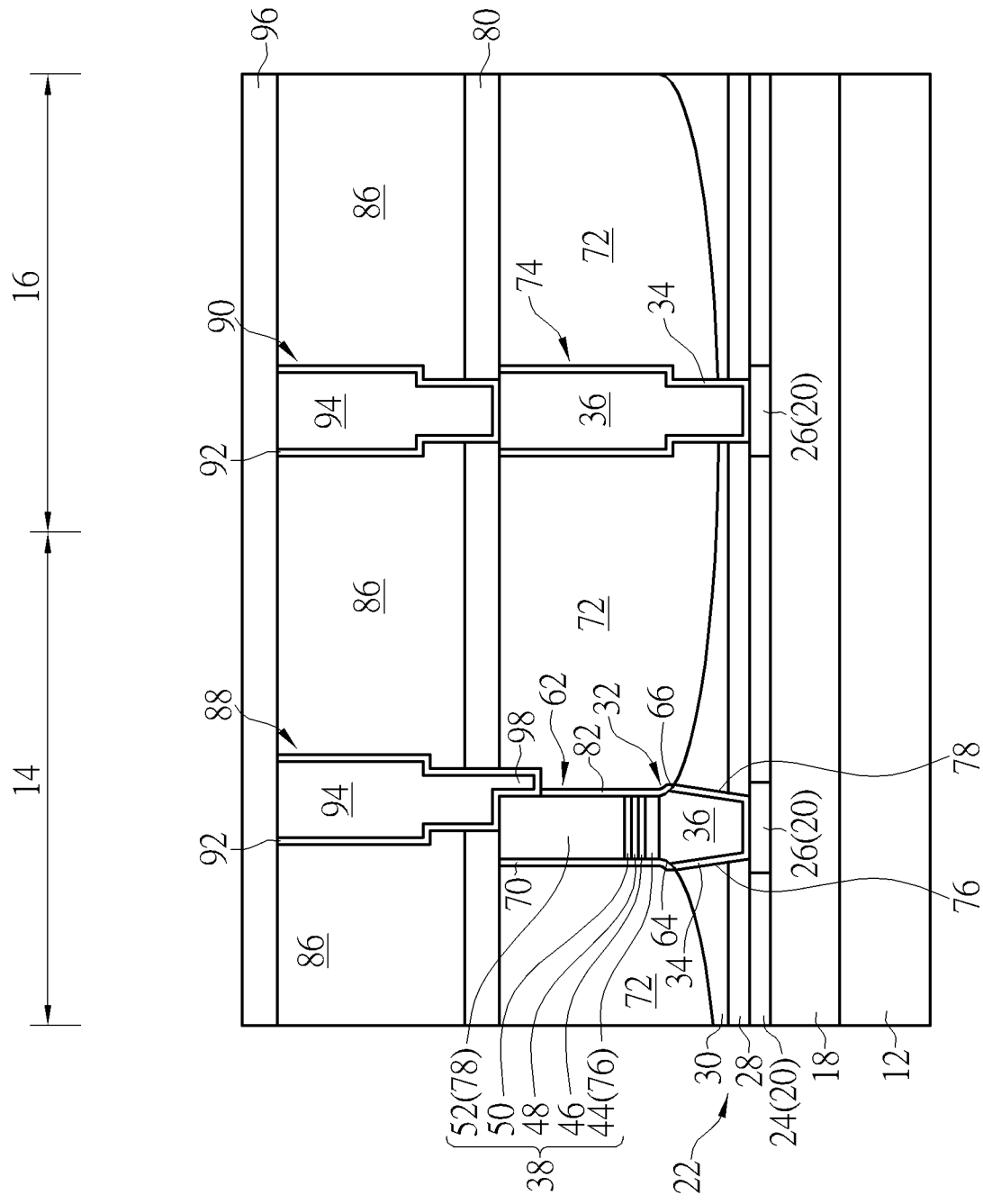

Next, as shown in FIG. 6, a stop layer 80 and another IMD layer 86 are formed on the MTJ 62 to cover the surface of the IMD layer 72, and one or more photo-etching process is conducted to remove part of the IMD layer 86, part of the stop layer 80, part of the IMD layer 72, and even part of the second spacer 82 on the MTJ region 14 and part of the IMD layer 86 and part of the stop layer 80 on the logic region 16 to form contact holes (not shown). Next, conductive materials are deposited into each of the contact holes and a planarizing process such as CMP is conducted to form metal interconnections 88, 90 directly connecting the MTJ 62 and contact plug 74 on the MTJ region 14 and logic region 16, in which the metal interconnection 88 on the MTJ region 14 preferably directly contacting the MTJ 62 underneath while the metal interconnection 90 on the logic region 16 directly contacts the contact plug 74 on the lower level. Next, another stop layer 96 is formed on the IMD layer 86 to cover the metal interconnections 88, 90.

In this embodiment, the stop layer 80 and the stop layer 28 could be made of same material or different material. For example, both layers 80, 28 could include nitrogen doped carbide (NDC), silicon nitride, silicon carbon nitride (SiCN), or combination thereof. Similar to the metal interconnections formed previously, each of the metal interconnections 88, 90 could be formed in the IMD layer 86 through a single damascene or dual damascene process. For instance, each of the metal interconnections 88, 90 could further include a barrier layer 92 and a metal layer 94, in which the barrier layer 92 could be selected from the group consisting of titanium (Ti), titanium nitride (TiN), tantalum (Ta), and tantalum nitride (TaN) and the metal layer 94 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

It should be noted that when a photo-etching process is conducted to form the metal interconnection 88 on the MTJ region 14 in FIG. 6, it would be desirable to adjust the position of the mask so that the etching process not only removes the stop layer 80 and IMD layer 86 directly on top of the MTJ 62 but also part of the IMD layer 72 and even part of the second spacer 82 adjacent to the MTJ 62 to create a dislocation, misalignment, or shift in position between the metal interconnection 88 and the MTJ 62 underneath. In other words, not only the bottom (or bottommost) surface of the metal interconnection 88 directly contacts the top (or topmost) surface of the MTJ 62, at least part of the metal interconnection 88 such as a sidewall of the metal interconnection 88 also contacts a sidewall of the MTJ 62 directly.

Viewing from a structural perspective, as shown in FIG. 6, the semiconductor device preferably includes a MTJ 62 disposed on the substrate 12 on the MTJ region 14, a metal interconnection 74 disposed on the logic region 16 adjacent to the MTJ 62, an IMD layer 72 surrounding the MTJ 62 and the metal interconnection 74, a metal interconnection 32 connecting and directly contacting the bottom surface of the MTJ 62, a metal interconnection 88 connecting and directly contacting the top surface and part of the sidewall of the MTJ 62, another metal interconnection 90 connecting and directly contacting the metal interconnection 74, an IMD layer 86 surrounding the metal interconnections 88, 90, a stop layer 80 disposed between the IMD layer 72 and the IMD layer 86, and another stop layer 96 covering the metal interconnections 88, 90 and the IMD layer 86.

In this embodiment, the MTJ 62 preferably includes a bottom electrode 76, a fixed layer 46, a free layer 48, a capping layer 50, and a top electrode 78, a first spacer 70 is disposed on one sidewall of the MTJ 62, and a second spacer 82 is on another sidewall of the MTJ 62, in which the first spacer 70 and the second spacer 82 are preferably asymmetric structures. Viewing from a more detailed perspective, the bottom surface of the first spacer 70 preferably contacts the first inclined or slanted sidewall 64, the bottom surface of the second spacer 82 contacts the second inclined or slanted sidewall 66 directly, the top or topmost surface of the first spacer 70 is even with top surface of the top electrode 78 of MTJ 62, and the top or topmost surface of the second spacer 82 is lower than the top surface of the top electrode 78 but higher than the top surface of the capping layer 50. In other words, the first spacer 70 and the second spacer 82 preferably have different heights.

Moreover, the metal interconnection 88 directly on top of the MTJ 62 preferably includes a protrusion 98 directly contacting a sidewall of the top electrode 78. Since the second spacer 82 does not cover the sidewall of the MTJ 62 entirely thereby exposing part of the sidewall of the MTJ 62, the protrusion 98 preferably contacts the top electrode 78, the second spacer 82, and the IMD layer 72 directly and the bottom surface of the protrusion 98 is preferably higher than the top surface of the capping layer 50. It should be noted that even though the metal interconnection 88 is shifting toward the right side of the MTJ 62 in this embodiment, according to other embodiment of the present invention, the metal interconnection 88 could also be shifting toward the left side of the MTJ 62 so that the protrusion 98 could contact the left sidewall of the MTJ 62 directly, or even two protrusions could be extended downward from two sides of the metal interconnection 88 to directly contact left and right sidewalls of the MTJ 62 at the same time, which are all within the scope of the present invention.

Figure 7:
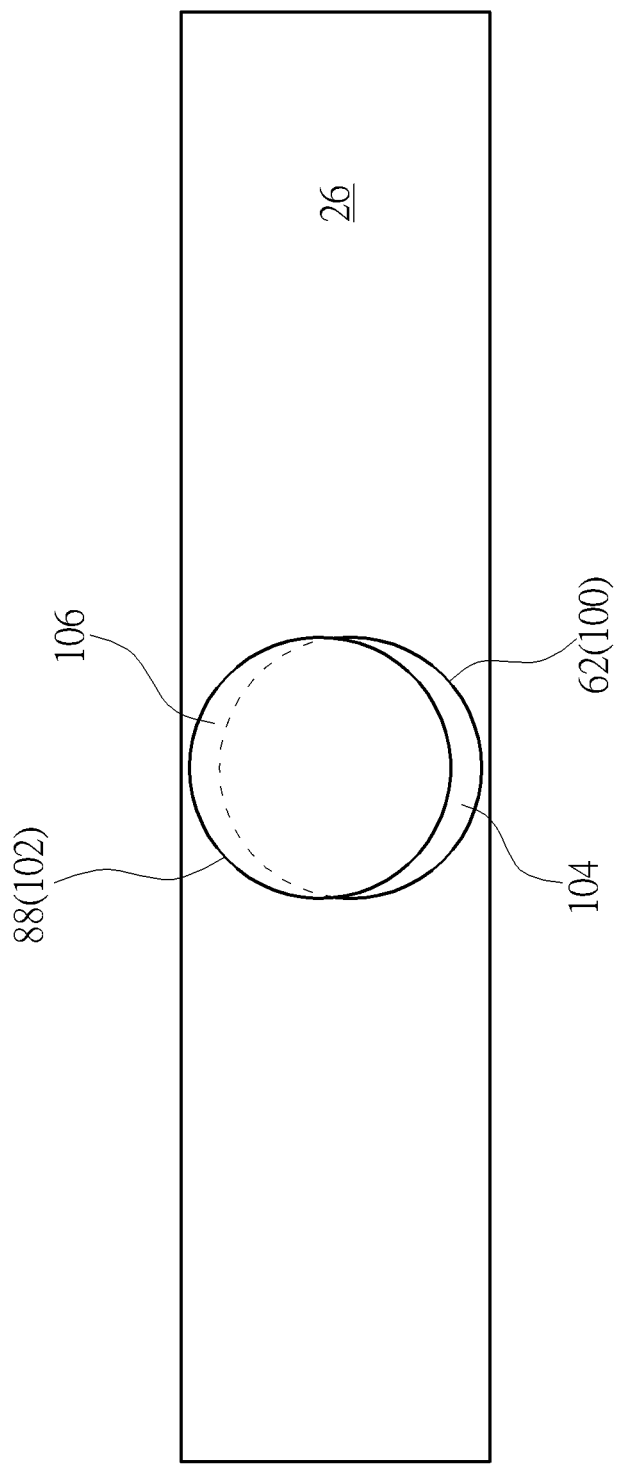
FIG. 7 illustrates a top view of a portion of MTJ overlapped by metal interconnection shown in FIG. 6 according to an embodiment of the present invention.

Referring to FIG. 7, FIG. 7 illustrates a top view of a portion of MTJ 62 overlapped by metal interconnection 88 shown in FIG. 6 according to an embodiment of the present invention. As shown in FIG. 7, the present embodiment includes a MTJ 62 disposed on the substrate 12 or metal interconnection 26 and a metal interconnection 88 disposed on top of the MTJ 62, in which a top view of the MTJ 62 includes a first circle 100 and a top view of the metal interconnection 88 includes a second circle 102 overlapping part of the first circle 100. Viewing from a more detailed perspective, part of the first circle 100 not overlapped by the second circle 102 includes a first crescent moon 104, and part of the second circle 102 not overlapping the first circle 100 includes a second crescent moon 106, in which the first crescent moon 104 and the second crescent moon 106 are disposed symmetrically such as being mirror images to each other, and the sizes, areas, and/or circumferences of the two crescent moons 104, 106 are preferably equal.

It should be noted that even though the first circle 100 and the second circle 102 preferably share equal size such as equal or same diameters, according to an embodiment of the present invention, the first circle 100 and the second circle 102 could also include different sizes. For instance, the size or diameter of the first circle 100 could be greater than the size or diameter of the second circle 102 and in such instance, it would be desirable to obtain asymmetrical crescent moons when the first circle 100 is overlapped by the second circle 102. For instance under such circumstance, the first crescent moon 104 and the second crescent moon 106 could include different sizes, different areas, and/or different circumferences, in which different size could be defined as the size of first crescent moon 104 being greater than or less than the size of the second crescent moon 106, which are all within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a magnetic tunneling junction (MTJ) on a substrate;
a first spacer on one side of the MTJ; and
a second spacer on another side of the MTJ, wherein the first spacer and the second spacer are asymmetric, a top surface of the second spacer is lower than a top surface of the first spacer, the top surface of the first spacer comprises a first planar surface parallel to a top surface of the substrate, the top surface of the second spacer comprises a second planar surface parallel to the top surface of the substrate, and the first planar surface and the second planar surface comprise equal widths.

2. The semiconductor device of claim 1, further comprising:
- a first inter-metal dielectric (IMD) layer on the substrate; and
- a first metal interconnection under the MTJ and in the first IMD layer, wherein the first metal interconnection comprises a first slanted sidewall and a second slanted sidewall.

3. The semiconductor device of claim 2, wherein the first spacer contacts the first slanted sidewall directly.

4. The semiconductor device of claim 2, wherein the second spacer contacts the second slanted sidewall directly.

5. The semiconductor device of claim 2, wherein the MTJ comprises:
- a bottom electrode on the first metal interconnection;
- a capping layer on the bottom electrode; and
- a top electrode on the capping layer.

6. The semiconductor device of claim 5, wherein the top surface of the first spacer is even with a top surface of the top electrode.

7. The semiconductor device of claim 5, wherein the top surface of the second spacer is lower than a top surface of the top electrode.

8. The semiconductor device of claim 5, further comprising a second IMD layer on the first IMD layer and around the MTJ.

9. The semiconductor device of claim 8, further comprising a second metal interconnection on the MTJ and the second IMD layer, wherein the second metal interconnection comprises a protrusion contacting a sidewall of the top electrode.

10. The semiconductor device of claim 9, wherein the protrusion contacts the top electrode, the second spacer, and the second IMD layer directly.

11. The semiconductor device of claim 9, wherein a bottom surface of the protrusion is higher than a top surface of the capping layer.

* * * * *